United States Patent [19]

Saruwatari

[11] Patent Number: 6,008,668
[45] Date of Patent: Dec. 28, 1999

[54] SEMICONDUCTOR DEVICE AND INPUT AND OUTPUT CIRCUITS THEREOF

[75] Inventor: Yasuhiro Saruwatari, Tokyo, Japan

[73] Assignee: NEC Corporation, Tokyo, Japan

[21] Appl. No.: 09/040,403

[22] Filed: Mar. 18, 1998

[30] Foreign Application Priority Data

Mar. 21, 1997 [JP] Japan ..................... 9-067967

[51] Int. Cl.$^6$ ............... H03K 19/0175; H03K 17/16; H03K 19/003; H03K 19/094
[52] U.S. Cl. .................. 326/81; 326/34; 326/88; 326/33
[58] Field of Search .............. 326/81, 34, 88, 326/33, 31, 80, 82, 83, 86

[56] References Cited

U.S. PATENT DOCUMENTS

| | | | |
|---|---|---|---|
| 4,745,305 | 5/1988 | Crafts ........................................ | 326/86 |
| 4,902,915 | 2/1990 | Tran .......................................... | 326/32 |
| 5,047,670 | 9/1991 | Tran .......................................... | 326/65 |
| 5,612,630 | 3/1997 | Wright et al. ............................. | 326/22 |
| 5,838,168 | 11/1998 | Petersen .................................... | 326/81 |
| 5,914,618 | 6/1999 | Mattos ...................................... | 326/87 |

FOREIGN PATENT DOCUMENTS

3-210815  9/1991  Japan .

*Primary Examiner*—Michael Tokar
*Assistant Examiner*—Daniel D. Chang
*Attorney, Agent, or Firm*—McGinn & Gibb, P.C.

[57] ABSTRACT

In an input circuit of a semiconductor device, a CMOS inverter has first and second transistors connected in series between an external power supply and ground and complementarily operating in accordance with an input signal. The first and second transistors have a connection point connected to an output terminal. A first switching device is connected in parallel to the second transistor and turned on/off. A comparator compares a voltage from the external power supply with a predetermined reference voltage and outputs a reference signal representing a comparison result. A logic circuit performs a logical operation between the reference signal from the comparator and the input signal supplied to an input terminal of the CMOS inverter and ON/OFF-controls the first switching device on the basis of a logical operation result. The logic circuit turns off the first switching device when the reference signal from the comparator represents that the voltage from the external power supply is lower than the predetermined reference voltage, and otherwise, turns on/off the first switching device in accordance with a level of the input signal to the CMOS inverter.

11 Claims, 4 Drawing Sheets

SEMICONDUCTOR DEVICE AND INPUT AND OUTPUT CIRCUITS THEREOF

BACKGROUND OF THE INVENTION

The present invention relates to a semiconductor device and input and output circuits thereof and, more particularly, to the input and output circuits of a wide-range compatible semiconductor device which is operated at different external power supply voltages Vcc.

Figure 5:
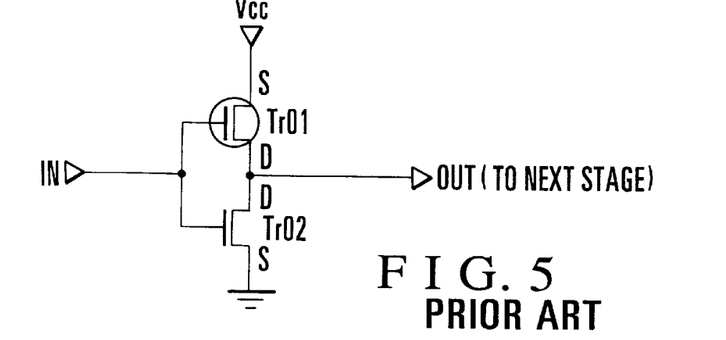
FIG. 5 is a circuit diagram of a conventional input circuit.

In recent years, semiconductor devices such as static RAMs (SRAMs) which are operated on a single chip in a wide range by an external power supply voltage Vcc from a low voltage of, e.g., about 3 V to a relatively high voltage of 5.5 V have been provided. Such a semiconductor device conventionally has an input circuit constituted by a CMOS inverter comprising a p-channel transistor Tr01 having a source to which the external power supply voltage Vcc is applied and a drain connected to the output terminal, and an n-channel transistor Tr02 having a drain connected to the output terminal and a source grounded, as shown in FIG. 5. The gates of the p-channel transistor Tr01 and the n-channel transistor Tr02 are commonly connected to the input terminal.

Figure 6A:
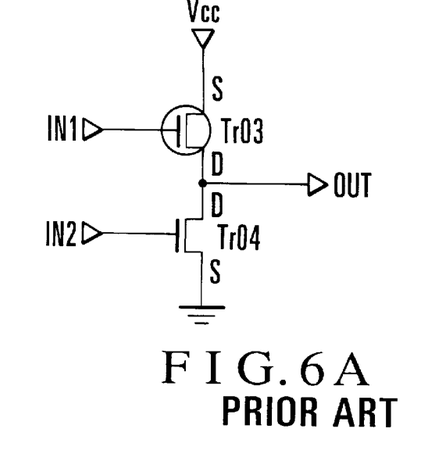
FIGS. 6A and 6B are circuit diagrams of conventional output circuits.

FIGS. 6A and 6B show conventional output circuits. The output circuit shown in FIG. 6A comprises a p-channel transistor Tr03 having a source to which the external power supply voltage Vcc is applied, a drain connected to the output terminal, and a gate connected to the first input terminal, and an n-channel transistor Tr04 having a drain connected to the output terminal, a source grounded, and a gate connected to the second input terminal (this output circuit arrangement will be referred to as a P-N arrangement hereinafter).

The output circuit shown in FIG. 6B comprises an n-channel transistor Tr05 having a drain to which the external power supply voltage Vcc is applied, a source connected to the output terminal, and a gate connected to the first input terminal, and an n-channel transistor Tr06 having a drain connected to the output terminal, a source grounded, and a gate connected to the second input terminal (this output circuit arrangement will be referred to as an N—N arrangement hereinafter).

However, use of the input and output circuits having the above arrangements for a wide-range compatible semiconductor device poses the following problems.

As the first problem, in the conventional input circuit (FIG. 5), the margin between a specification and a voltage VIH of an input signal IN at which the output signal changes from high level "H" to low level "L", and the margin between a specification value and a voltage VIL of the input signal IN at which the output signal changes from low level "L" to high level "H" can hardly be sufficiently ensured over the wide-range external power supply voltage Vcc.

More specifically, the voltage VIH of the input signal IN capable of switching an output signal OUT from the input circuit from high level "H" to low level "L" depends on the external power supply voltage Vcc and the size ratio of the p-channel transistor Tr01 to n-channel transistor Tr02 constituting the CMOS inverter. This means that assuming that the size ratio of the output transistor Tr01 to Tr02 does not change, as the external power supply voltage Vcc rises, the voltage VIH also becomes high, so the margin to the specification value becomes small.

If the margin becomes small, the device is likely to erroneously operate when the GND level varies due to an electromotive force based on the inductance component of the circuit and interconnection. In other words, when a large current flows from an external circuit connected to the input circuit to GND, the drain potential of the grounded n-channel transistor Tr02 exceeds the actual GND level due to the inductance component. This decreases the margin of the voltage VIH, so the high-voltage operation becomes unstable.

To avoid this problem, the n-channel transistor Tr02 may be made larger than the p-channel transistor Tr01, i.e., the size ratio may be increased to lower the voltage VIH. In this case, the margin to the specification value associated with the voltage VIH in the high-voltage operation can be ensured, although the margin to the specification value of the voltage VIL representing low level "L" in an operation at a low power supply voltage Vcc becomes small. As a result, the device erroneously operate depending on the external power supply voltage Vcc, so the operation becomes unstable.

For the semiconductor device which operates at the wide-range power supply voltage Vcc, a high access speed is required even in the low-voltage operation. As the second problem, the conventional output circuit cannot increase the size of the output transistor because of the influence of noise, so the access speed in the low-voltage operation cannot be increased.

Figure 6B:
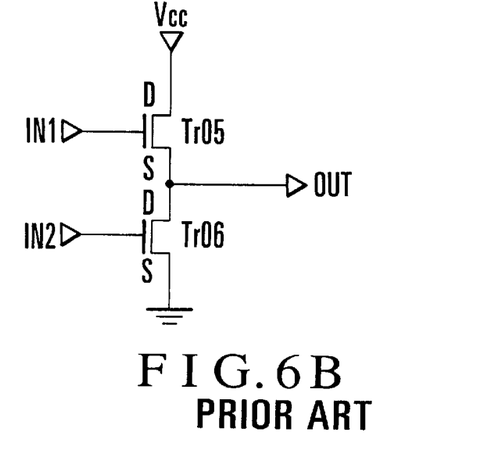

More specifically, to realize a high-speed low-voltage operation in the conventional output circuit, the sizes of the transistors Tr03 and Tr04 with the P-N arrangement shown in FIG. 6A or the sizes of the transistors Tr05 and Tr06 with the N—N arrangement shown in FIG. 6B must be increased. However, when the sizes are increased, a large current flows to the output transistors during output transition in the operation at a high power supply voltage Vcc, so the device is affected by noise. This imposes limitations on the transistor sizes by itself. For this reason, the conventional output circuit cannot simultaneously solve the problem of noise in the high-voltage operation of the wide-range semiconductor device and the problem of access speed in the low-voltage operation.

In the output circuit having the N—N arrangement shown in FIG. 6B, when a voltage of high level is output, i.e., when the n-channel transistor Tr05 to which the external power supply voltage Vcc is applied is ON, a potential difference VT is generated between the drain and the source. As a result, when the output circuit outputs a voltage of high level, the voltage OUT at the output terminal is (Vcc−VT). In the operation at a low external power supply voltage Vcc, the specification value associated with a voltage VOH representing that the output signal OUT is at high level "H" can hardly be satisfied because of the voltage drop corresponding to the potential difference VT in the high-voltage-side output transistor Tr05, resulting in an erroneous operation.

SUMMARY OF THE INVENTION

It is an object of the present invention to provide a semiconductor device which stably operates at a high access speed over a wide-range external power supply voltage Vcc, and input and output circuits thereof.

In order to achieve the above object, according to the present invention, there is provided an input circuit of a semiconductor device, comprising a CMOS inverter having first and second transistors connected in series between an external power supply and ground and complementarily operating in accordance with an input signal, the first and second transistors having a connection point connected to an output terminal, a first switching device connected in parallel to the second transistor and turned on/off, voltage comparison means for comparing a voltage from the external power supply with a predetermined reference voltage and outputting a reference signal representing a comparison result, and logical operation means for performing a logical operation between the reference signal from the comparison means and the input signal supplied to an input terminal of the CMOS inverter and ON/OFF-controlling the first switching device on the basis of a logical operation result, wherein the logical operation means turns off the first switching device when the reference signal from the voltage comparison means represents that the voltage from the external power supply is lower than the predetermined reference voltage, and turns on/off the first switching device in accordance with a level of the input signal to the CMOS inverter when the reference signal from the voltage comparison means represents that the voltage from the external power supply is higher than the predetermined reference voltage.

DESCRIPTION OF THE PREFERRED EMBODIMENT

The present invention will be described below in detail with reference to the accompanying drawings.

Figure 1:
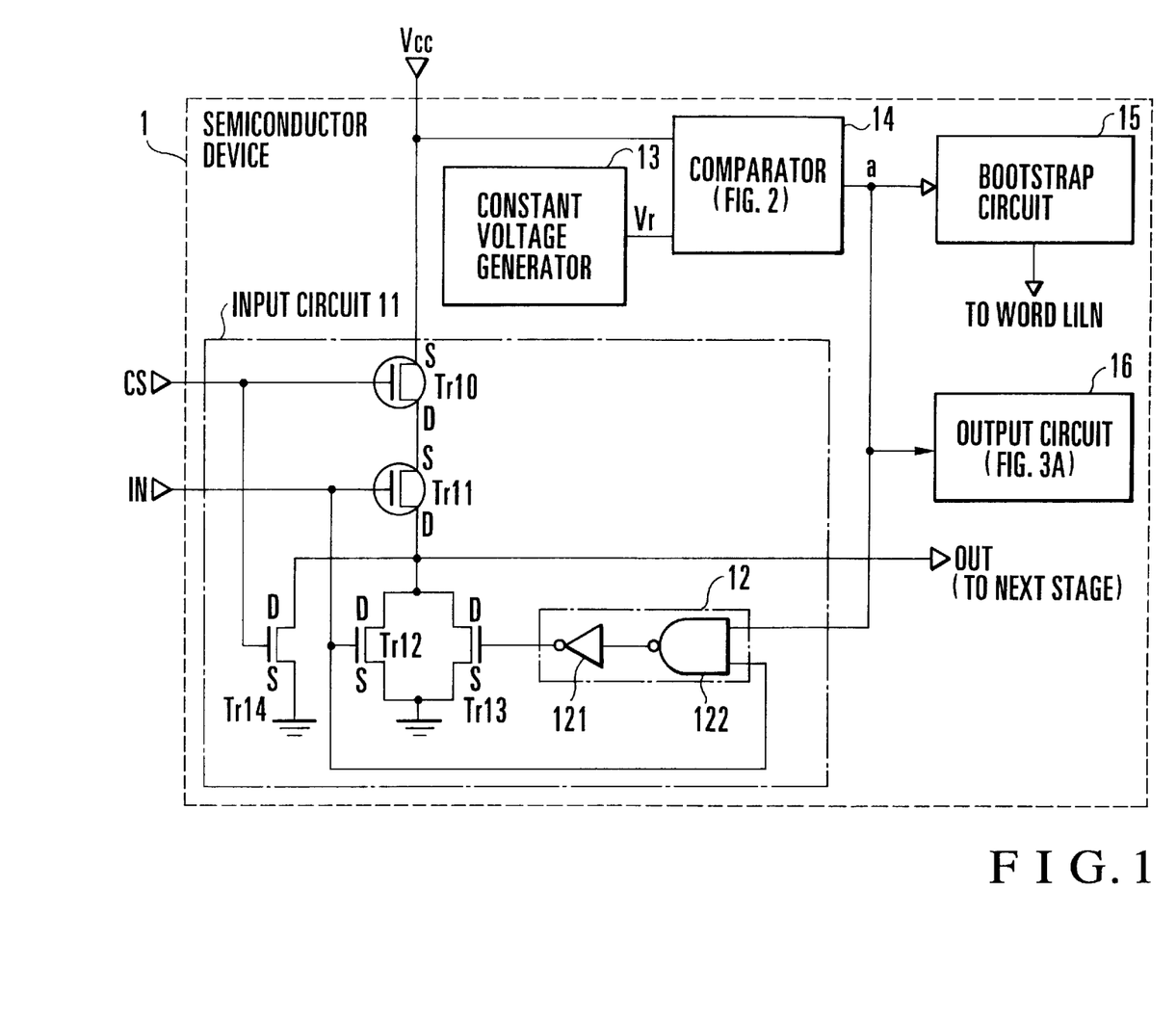
FIG. 1 is a circuit diagram of the input and output circuits of a semiconductor device according to an embodiment of the present invention.

FIG. 1 shows the input and output circuits of a semiconductor device according to an embodiment of the present invention. Referring to FIG. 1, a semiconductor device 1 to which an external power supply voltage Vcc is applied is constituted by a wide-range compatible general-purpose SRAM (Static Random Access Memory) comprising an input circuit 11, a constant voltage generator 13, a comparator 14, a bootstrap circuit 15, and an output circuit 16. For the descriptive convenience, word lines and memory cells constituting the semiconductor device are omitted.

The comparator 14 compares the external power supply voltage Vcc with a predetermined reference voltage VREF and outputs a binary signal a of high level when the external power supply voltage Vcc is equal to or higher than the reference voltage VREF, and the binary signal a of low level when the external power supply voltage Vcc is lower than the reference voltage VREF. In this embodiment, the reference voltage VREF used by the comparator 14 is set at 4 V.

In the low-voltage operation, i.e., when the external power supply voltage Vcc is lower than 4 V, the general-purpose SRAM 1 activates the bootstrap circuit 15 to boost the voltage level of a signal to be output to a word line, thereby writing information in a memory cell (not shown).

That is, the output a from the comparator 14 is used as an activation signal for activating the bootstrap circuit 15 in the low-voltage operation.

In the following description, the predetermined reference voltage VREF is set at 4 V, and an operation at the external power supply voltage Vcc of 4 V or more will be referred to as a high-voltage operation, and an operation at the external power supply voltage Vcc lower than 4 V as a low-voltage operation.

Figure 2:
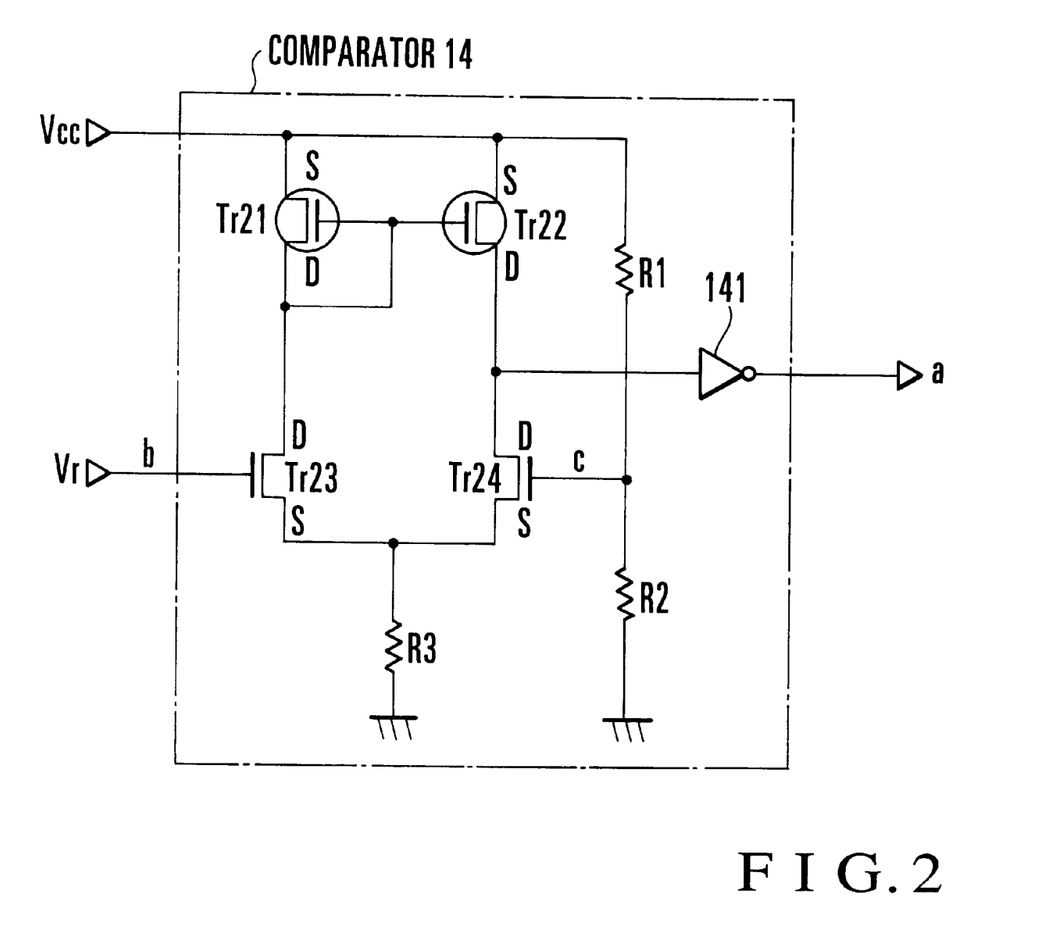
FIG. 2 is a circuit diagram of a comparator shown in FIG. 1.

FIG. 2 shows the comparator 14 shown in FIG. 1. Referring to FIG. 2, the comparator 14 comprises a p-channel transistor Tr21 having a source to which the external power supply voltage Vcc is applied, and a drain connected to a gate, a p-channel transistor Tr22 having a source to which the external power supply voltage Vcc is applied, a drain connected to the input terminal of an inverter 141, and a gate connected to the gate of the p-channel transistor Tr21, an n-channel transistor Tr23 having a drain connected to the drain of the p-channel transistor Tr21, a source grounded through a current adjustment resistor R3, and a gate to which a reference voltage Vr from the constant voltage generator 13 is applied, an n-channel transistor Tr24 having a drain connected to the input terminal of the inverter 141, a source grounded through the current adjustment resistor R3, and a gate to which a divided voltage is applied, and voltage dividing resistors R1 and R2 for dividing the external power supply voltage Vcc and applying the divided voltage to the gate of the n-channel transistor Tr24. The inverter 141 inverts the drain outputs from the p-channel transistor Tr22 and the n-channel transistor Tr24 to generate the output a.

The resistance values of the resistors R1 and R2 are appropriately selected such that the divided voltage equals the reference voltage Vr obtained from the constant voltage generator 13 when the external power supply voltage Vcc is 4 V. With this arrangement, the output a from the comparator 14 is set at high level when the external power supply voltage Vcc is 4 V or more and at low level when the external power supply voltage Vcc is lower than 4 V.

Referring back to FIG. 1, the input circuit 11 comprises a p-channel transistor Tr10 having a source to which the external power supply voltage Vcc is applied, and a gate to which a chip select signal CS is supplied, a p-channel transistor Tr11 having a source connected to the drain of the p-channel transistor Tr10, a drain connected to the output terminal, and a gate connected to the input terminal, an n-channel transistor Tr12 having a drain connected to the output terminal, a source grounded, and a gate connected to the input terminal, an n-channel transistor Tr13 having a drain connected to the output terminal, and a source grounded, an n-channel transistor Tr14 having a drain connected to the output terminal, a source grounded, and a gate to which the chip select signal CS is supplied, and a logic circuit 12 for supplying a logic output to the gate of the n-channel transistor Tr13.

The logic circuit 12 is constituted by a NAND gate 122 for receiving two inputs, i.e., the output a from the comparator 14 and the input signal IN, and an inverter 121 for inverting the output from the NAND gate 122 and outputting the signal to the gate of the n-channel transistor Tr13 connected in parallel to the n-channel transistor Tr12. The p-channel transistor Tr11 and the n-channel transistor Tr12 constitute a CMOS inverter for receiving the input signal IN and outputting the output signal OUT to the output-side circuit.

As described above, the p-channel transistor Tr10 is inserted between the external power supply voltage Vcc and the p-channel transistor Tr11 constituting the CMOS inverter, and the n-channel transistor Tr14 is arranged parallel to the n-channel transistor Tr12. The chip select signal CS which is at high level in the standby state of the input circuit 11 and at low level in the active state of the input circuit 11 is input to the gates of the two transistors Tr10 and Tr14. With this operation, even when the input signal IN is at the intermediate level in the standby state, flowing of a punch-through current to the CMOS inverter can be prevented.

The output a from the comparator 14, which is input to the bootstrap circuit 15 and the logic circuit 12, also acts as an activation signal for the bootstrap circuit 15 and a reference signal for the input circuit 11.

In the input circuit 11 having the above arrangement, a signal of high level is input from the comparator 14 to the NAND gate 122 in the high-voltage operation, so the logic circuit 12 inputs the input signal IN of the input circuit 11 to the gate of the n-channel transistor Tr13. Therefore, the n-channel transistor Tr13 operates in synchronism with the n-channel transistor Tr12 constituting the CMOS inverter. For this reason, the size ratio of the input circuit 11 becomes large as compared to a case wherein the input circuit comprises a CMOS inverter constituted only by the p-channel transistor Tr11 and the n-channel transistor Tr12. Consequently, an actual voltage VIH of the input signal IN at which the output signal changes from high level "H" to low level "L" can be set to be lower than that for an input circuit constituted only by the p-channel transistor Tr11 and the n-channel transistor Tr12, so the margin between the specification value (2.2 V for a general-purpose SRAM) associated with the voltage VIH and the actual voltage VIH can be increased. Therefore, the high-voltage operation can be stabilized.

On the other hand, when the external power supply voltage Vcc is lower than 4 V, a signal of low level is input to the NAND gate 122, so the logic circuit 12 always outputs a signal of low level. Therefore, the n-channel transistor Tr13 is turned off, resulting in a lower size ratio than that in the high-voltage operation. In the low-voltage operation, the input circuit 11 is constituted only by the p-channel transistor Tr11 and the n-channel transistor Tr12.

With this arrangement, the margin between an actual voltage VIL of the input signal at which the output signal from the input circuit 11 changes from low level "L" to high level "H" and the specification value associated with the voltage VIL can be ensured. At this time, the ratio of the voltage VIH to the external power supply voltage Vcc increases. However, since the external power supply voltage Vcc is low, a sufficient margin can be ensured between the voltage VIH and the specification value associated with the voltage VIH.

As described above, by automatically optimizing the size ratio in the high- and low-voltage operations, a stable operation is enabled even in use in a wide range.

Figure 3A:
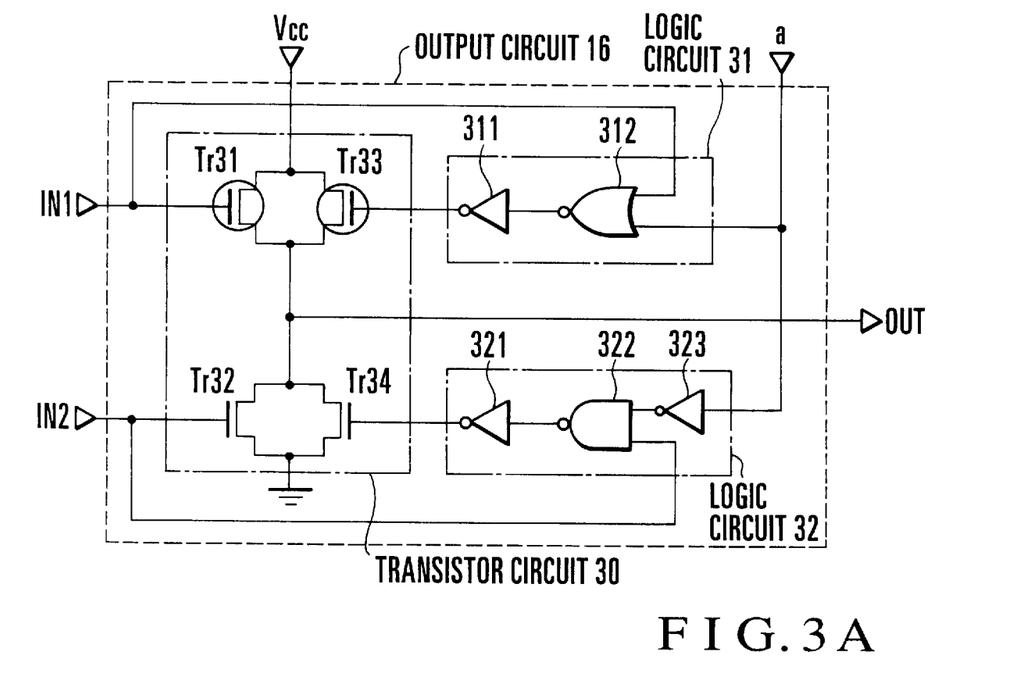
FIG. 3A is a circuit diagram according to an example of the output circuit shown in FIG. 1.

FIG. 3A shows the output circuit 16 shown in FIG. 1. In FIG. 3A, the output circuit 16 comprises a transistor circuit 30 having four transistors Tr31, Tr32, Tr33, and Tr34, and two logic circuits 31 and 32. The output signal OUT takes one of three states "H", "L", and "no output" in correspondence with combinations (L, L), (L, H), and (H, L) of two input signals IN1 and IN2.

The transistor circuit 30 comprises the p-channel transistor Tr31 having a source connected to the external power supply voltage Vcc, a drain connected to the output terminal, and a gate for receiving the first input signal IN1, the n-channel transistor Tr32 having a drain connected to the output terminal, a source grounded, and a gate for receiving the second input signal IN2, the p-channel transistor Tr33 having a source to which the external power supply voltage Vcc is applied, and a drain connected to the output terminal, and the n-channel transistor Tr34 having a drain connected to the output terminal, and a source grounded. The output from the logic circuit 31 is supplied to the gate of the p-channel transistor Tr33. The output from the logic circuit 32 is supplied to the gate of the n-channel transistor Tr34.

The logic circuit 31 is constituted by a NOR gate 312 for receiving two inputs, i.e., the input signal IN1 and the output a from the comparator 14 (FIG. 1), and an inverter 311 for inverting the output from the NOR gate 312 and supplying the signal to the gate of the p-channel transistor Tr33. The logic circuit 32 is constituted by an inverter 323 for inverting the output a from the comparator 14, a NAND gate 322 for receiving two inputs, i.e., the output from the inverter 323 and the input signal IN2, and an inverter 321 for inverting the output from the NAND gate 322 and supplying the signal to the gate of the n-channel transistor Tr34.

As described above, the output a from the comparator 14 is set at high level in the high-voltage operation, i.e., when the external power supply voltage Vcc is equal to or higher than the reference voltage VREF of 4 V, and at low level in the low-voltage operation, i.e., when the external power supply voltage Vcc is lower than 4 V.

Figure 3B:
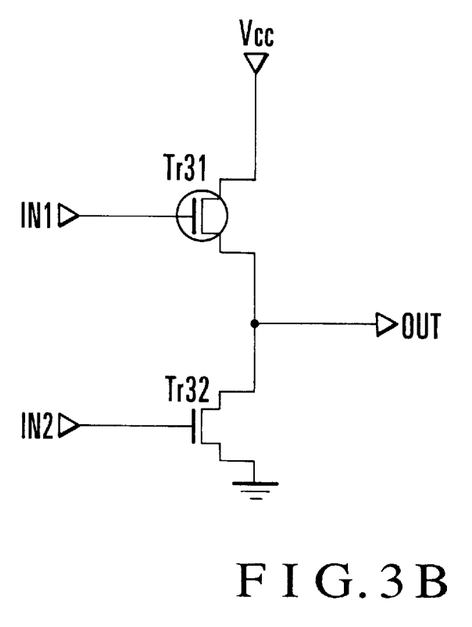
FIGS. 3B and 3C are equivalent circuit diagrams of the output circuit shown in FIG. 1.

In the output circuit 16 having the above arrangement, in the high-voltage operation, the logic circuit 31 always output a signal of high level independently of the input signal IN1 to turn off the p-channel transistor Tr33. The logic circuit 32 outputs a signal of low level independently of the input signal IN2 to turn off the n-channel transistor Tr34. Therefore, the output circuit 16 operates as the output circuit 16 having a P-N arrangement constituted by the p-channel transistor Tr31 and the n-channel transistor Tr32, as shown in FIG. 3B.

Figure 3C:
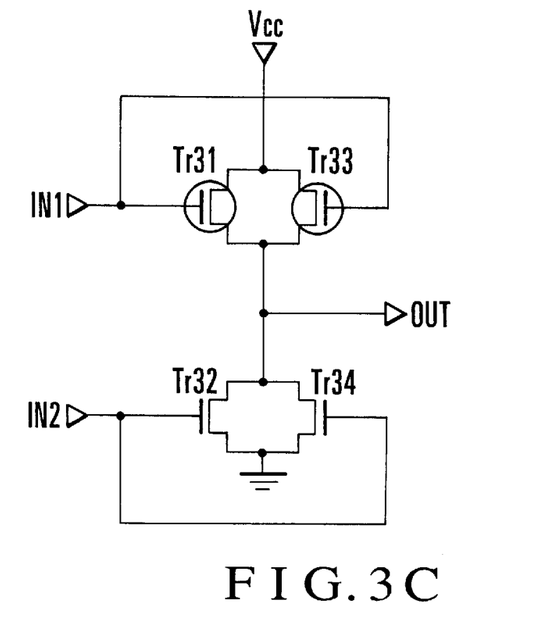

On the other hand, in the low-voltage operation, the logic circuits 31 and 32 output the input signals IN1 and IN2, respectively. The p-channel transistor Tr33 and the n-channel transistor Tr34 are turned on/off in synchronism with the p-channel transistor Tr31 and the n-channel transistor Tr32 in accordance with the input signals IN1 and IN2, respectively. This means that the output circuit 16 operates as an output circuit in which the high-potential-side output transistor is constituted by the two p-channel transistors Tr31 and Tr33, and the low-potential-side output transistor is constituted by the two n-channel transistors Tr32 and Tr34, as shown in FIG. 3C. Therefore, the size of the output transistors becomes larger than that in the high-voltage operation, so high-speed access can be performed even in the low-voltage operation.

As described above, by automatically changing the size of the output transistors in the high- and high-voltage operations, the problem of noise in the high-voltage operation and the problem of the operation speed in the low-voltage operation can be simultaneously solved.

Figure 4:
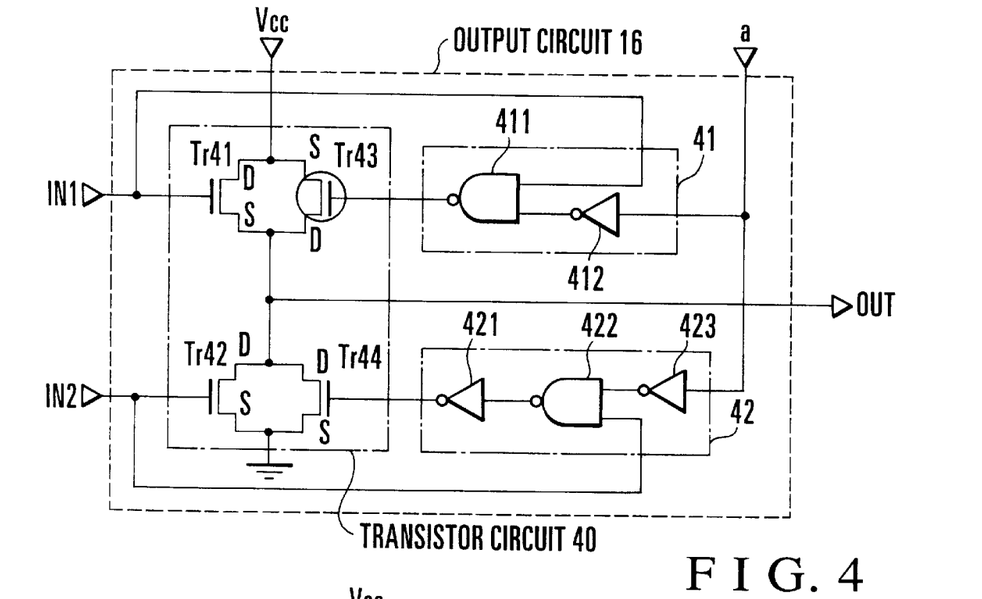
FIG. 4 is a circuit diagram according to another example of the output circuit shown in FIG. 1.

FIG. 4 shows another example of the output circuit 16 shown in FIG. 1. The output circuit 16 shown in FIG. 4 also comprises a transistor circuit 40 and two logic circuits 41 and 42, like the circuit shown in FIG. 3. The output signal OUT takes one of three states "H", "L", and "no output" in correspondence with combinations (H, L), (L, H), and (L, L) of the two input signals IN1 and IN2. The output circuit 16 does not use the input signal combination (H, H).

The transistor circuit 40 comprises an n-channel transistor Tr41 having a drain to which the external power supply voltage Vcc is applied, a source connected to the output terminal, and a gate to which the first input signal IN1 is supplied, an n-channel transistor Tr42 having a gate to which the second input signal IN2 is supplied, a drain connected to the output terminal, and a source grounded, a p-channel transistor Tr43 having a source to which the external power supply voltage Vcc is applied, and a drain connected to the output terminal, and an n-channel transistor Tr44 having a drain connected to the output terminal, and a source grounded. The output from the logic circuit 41 is supplied to the gate of the p-channel transistor Tr43. The output from the logic circuit 42 is supplied to the gate of the n-channel transistor Tr44.

The logic circuit 41 is constituted by an inverter 412 for inverting the output a from the comparator 14 (FIG. 1), and a NAND gate 411 for receiving two inputs, i.e., the input signal IN1 and the output from the inverter 412 and supplying the output to the gate of the p-channel transistor Tr43. The logic circuit 42 is constituted by an inverter 423 for inverting the output a from the comparator 14, a NAND gate 422 for receiving two inputs, i.e., the output from the inverter 423 and the input signal IN2, and an inverter 421 for inverting the output from the NAND gate 422 and supplying the signal to the gate of the n-channel transistor Tr44.

In the output circuit 16 having the above arrangement, in the high-voltage operation, the logic circuit 41 always supplies a signal of high level to the gate of the p-channel transistor Tr43 independently of the input signal IN1. The logic circuit 42 supplies a signal of low level to the gate of the n-channel transistor Tr44 independently of the input signal IN2. In the high-voltage operation, i.e., when the external power supply voltage Vcc is equal to or higher than the reference voltage VREF (4 V), the p-channel transistor Tr43 and the n-channel transistor Tr44 are always turned off. Therefore, the output circuit 16 operates as an output circuit having an N—N arrangement constituted by the n-channel transistors Tr41 and Tr42.

On the other hand, in the low-voltage operation, i.e., when the external power supply voltage Vcc is lower than the reference voltage VREF (4 V), the logic circuit 41 outputs the inverted signal of the input signal IN1, and the logic circuit 42 outputs the input signal IN2. The p-channel transistor Tr43 having a gate to which the inverted signal of the input signal IN1 is supplied is turned on/off in synchronism with the n-channel transistor Tr41 in accordance with the input signal IN1. The n-channel transistor Tr44 having a gate to which the input signal IN2 is supplied is turned on/off in synchronism with the n-channel transistor Tr42 in accordance with the input signal IN2.

As a result, the size of output transistors in the output circuit 16 in the low-voltage operation becomes larger by the size of the n-channel transistor Tr44, so the access speed can be increased.

By automatically changing the size of the output transistors in the high- and low-voltage operations, the problem of noise in the high-voltage operation and the problem of operation speed in the low-voltage operation can be simultaneously solved.

In addition, in the low-voltage operation, the p-channel transistor Tr43 is connected parallel to the high-voltage-side output transistor. When a signal of high level is output, i.e., when the n-channel transistor Tr41 connected to the external power supply voltage Vcc is ON, the influence of the potential difference VT generated between the drain and the source can be eliminated. Therefore, even in the operation at the low external power supply voltage Vcc, the specification value associated with the voltage VOH representing that the output signal OUT is at high level can be easily satisfied, so operation errors can be prevented.

To obtain a sufficiently high access speed in the low-voltage operation, the size of the p-channel transistor Tr43 is preferably made sufficiently large in accordance with the low-voltage operation condition.

According to the present invention, by automatically switching the input and output circuits to an appropriate size ratio or size on the basis of the external power supply voltage Vcc, the wide-range semiconductor device compatible to different external power supply voltages Vcc can be stably operated over a wide-range external power supply voltage Vcc at a high speed.

Since margins are ensured for the specification values associated with the voltage levels VIH and VIL of the input signal, operation errors of the circuit can be prevented even when the voltage levels VIH and VIL become unstable due to the influence of the inductance component, so the operation of the wide-range compatible semiconductor device can be stabilized.

When no signal is input to the input circuit, and the input terminal is set at the intermediate potential, flowing of a large current to the CMOS inverter is prevented, and the output terminal is grounded, so the operation of the input circuit can be stabilized.

The size of the output transistors is increased in the low-voltage operation to realize high-speed access. In the high-voltage operation, the size is reduced to minimize the influence of noise. Therefore, in the output circuit of the wide-range semiconductor device, the access speed in the low-voltage operation can be improved while suppressing noise in the high-voltage operation.

Since the influence of the potential difference VT between the drain and the source of the n-channel transistor in the output circuit having the N—N arrangement is eliminated, a margin can be ensured for the specification value associated with the voltage VOH representing that the output signal OUT is at high level. With this arrangement, any erroneous operation in the low-voltage operation can be prevented to stabilize the operation.

When the external power supply voltage Vcc is low, an activation signal for activating the bootstrap circuit is input to the logic circuits constituting the input and output circuits. For this reason, the voltage comparison means dedicated for the input and output circuits can be omitted.

What is claimed is:

1. An input circuit of a semiconductor device, comprising:
   a CMOS inverter having first and second transistors connected in series between an external power supply and ground and complementarily operating in accordance with an input signal, said first and second transistors having a connection point connected to an output terminal;
   a first switching device connected in parallel to said second transistor and turned on/off;
   voltage comparison means for comparing a voltage from said external power supply with a predetermined reference voltage and outputting a reference signal representing a comparison result; and
   logical operation means for performing a logical operation between the reference signal from said comparison means and the input signal supplied to an input terminal of said CMOS inverter and ON/OFF-controlling said first switching device on the basis of a logical operation result, wherein said logical operation means turns off said first switching device when the reference signal from said voltage comparison means represents that the voltage from said external power supply is lower than the predetermined reference voltage, and turns on/off said first switching device in accordance with a level of the input signal to said CMOS inverter when the reference signal from said voltage comparison means represents that the voltage from said external power supply is higher than the predetermined reference voltage.

2. A circuit according to claim 1, wherein said first transistor comprises a p-channel transistor having a source connected to said external power supply, a drain connected to said output terminal, and a gate connected to said input terminal, and said second transistor comprises an n-channel transistor having a drain connected to said output terminal, a source grounded, and a gate connected to said input terminal.

3. A circuit according to claim 2, wherein said first switching device comprises an n-channel transistor having a drain connected to said output terminal, a source grounded, and a gate to which a control signal from said logical operation means is supplied.

4. A circuit according to claim 2, further comprising a second switching device connected between said external power supply and said first transistor and turned on/off in accordance with an external control signal representing the presence/absence of the input signal to said CMOS inverter, and a third switching device connected in parallel to said second transistor and turned on/off in accordance with the external control signal, wherein said second switching device is turned on in the presence of the input signal to said CMOS inverter and off in the absence of the input signal, and said third switching device is turned off in the presence of the input signal to said CMOS inverter and on in the absence of the input signal.

5. A circuit according to claim 4, wherein said second switching device comprises a p-channel transistor having a source connected to said external power supply, a drain connected to said source of said first transistor, and a gate to which the external control signal is supplied, and said third switching device comprises an n-channel transistor having a drain connected to said output terminal, a source grounded, and a gate to which the external control signal is supplied.

6. An output circuit of a semiconductor device, comprising:

a transistor circuit for outputting an output signal corresponding to a combination of first and second input signals, said transistor circuit having first and second transistors connected between an external power supply and ground and turned on/off in accordance with the first and second input signals, and said first and second transistors having a connection point connected to an output terminal;

voltage comparison means for comparing a voltage from said external power supply with a predetermined reference voltage and outputting a reference signal representing a comparison result;

first logical operation means for performing a logical operation between the first input signal and the reference signal from said voltage comparison means and outputting a first control signal;

second logical operation means for performing a logical operation between the second input signal and the reference signal from said voltage comparison means and outputting a second control signal;

a first switching device connected in parallel to said first transistor and turned on/off in accordance with the first control signal from said first logical operation means; and a second switching device connected in parallel to said second transistor and turned on/off in accordance with the second control signal from said second logical operation means, wherein said first logical operation means turns off said first switching device when the reference signal from said voltage comparison means represents that the voltage from said external power supply is higher than the predetermined reference voltage, and turns on/off said first switching device in accordance with the first input signal in synchronism with said first transistor when the reference signal represents that the voltage from said external power supply is lower than the predetermined reference voltage, and said second logical operation means turns off said second switching device when the reference signal from said voltage comparison means represents that the voltage from said external power supply is higher than the predetermined reference voltage, and turns on/off said second switching device in accordance with the second input signal in synchronism with said second transistor when the reference signal represents that the voltage from said external power supply is lower than the predetermined reference voltage.

7. A circuit according to claim 6, wherein said first switching device comprises a p-channel transistor having a source connected to said external power supply, a drain connected to said output terminal, and a gate to which the control signal from said first logical operation means is supplied, and said second switching device comprises an n-channel transistor having a drain connected to said output terminal, a source grounded, and a gate to which the control signal from said second logical operation means is supplied.

8. A circuit according to claim 7, wherein said first transistor comprises a p-channel transistor having a source connected to said external power supply, a drain connected to said output terminal, and a gate to which the first input signal is supplied, and said second transistor comprises an n-channel transistor having a drain connected to said output terminal, a source grounded, and a gate to which the second input signal is supplied.

9. A circuit according to claim 7, wherein said first transistor comprises a n-channel transistor having a drain connected to said external power supply, a source connected to said output terminal, and a gate to which the first input signal is supplied, and said second transistor comprises an n-channel transistor having a drain connected to said output terminal, a source grounded, and a gate to which the second input signal is supplied.

10. A semiconductor device comprising:

bootstrap means for boosting a voltage level of a signal output to a memory cell through a word line;

a CMOS inverter having first and second transistors connected in series between an external power supply and ground and complementarily operating in accordance with an input signal, said first and second transistors having a connection point connected to an output terminal;

a first switching device connected in parallel to said second transistor and turned on/off;

voltage comparison means for comparing a voltage from said external power supply with a predetermined reference voltage and outputting a reference signal representing a comparison result, said voltage comparison means outputting the reference signal as an activation signal to said bootstrap means when the voltage from said external power supply is lower than the reference voltage; and logical operation means for performing logical operation between the reference signal from said comparison means and the input signal supplied to an input terminal of said CMOS inverter and ON/OFF-controlling said first switching device on the basis of a logical operation result.

11. A semiconductor device comprising:

bootstrap means for boosting a voltage level of a signal output to a memory cell through a word line;

a transistor circuit for outputting an output signal corresponding to a combination of first and second input signals, said transistor circuit having first and second transistors connected between an external power supply and ground and turned on/off in accordance with the first and second input signals, and said first and second transistors having a connection point connected to an output terminal;

voltage comparison means for comparing a voltage from said external power supply with a predetermined reference voltage and outputting a reference signal representing a comparison result, said voltage comparison means outputting the reference signal as an activation signal to said bootstrap means when the voltage from said external power supply is lower than the reference voltage;

first logical operation means for performing logical operation between the first input signal and the reference signal from said voltage comparison means and outputting a first control signal;

second logical operation means for performing logical operation between the second input signal and the reference signal from said voltage comparison means and outputting a second control signal;

a first switching device connected in parallel to said first transistor and turned on/off in accordance with the first control signal from said first logical operation means; and a second switching device connected in parallel to said second transistor and turned on/off in accordance with the second control signal from said second logical operation means.

* * * * *